(12) United States Patent
Mimotogi

(10) Patent No.: US 6,632,592 B1
(45) Date of Patent: Oct. 14, 2003

(54) RESIST PATTERN FORMING METHOD

(75) Inventor: Shoji Mimotogi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 23 days.

(21) Appl. No.: 09/657,049

(22) Filed: Sep. 7, 2000

(30) Foreign Application Priority Data

Sep. 9, 1999 (JP) .......................... 11-256205

(51) Int. Cl.⁷ .............. G03F 7/00; G03F 9/00; H01L 27/10
(52) U.S. Cl. .......... 430/322; 430/311; 430/394; 430/396; 430/5; 430/22
(58) Field of Search ............... 430/311, 327, 430/396, 394, 296; 716/19, 20, 21

(56) References Cited

U.S. PATENT DOCUMENTS

| | | | |
|---|---|---|---|
| 4,759,626 A | * | 7/1988 | Kroko .................... 356/124 |
| 5,563,012 A | * | 10/1996 | Neisser ................... 430/22 |
| 5,573,890 A | * | 11/1996 | Spence ................... 430/311 |
| 5,631,112 A | * | 5/1997 | Tsai et al. ............... 430/22 |
| 5,667,940 A | * | 9/1997 | Hsue ...................... 430/312 |
| 5,766,806 A | * | 6/1998 | Spence .................... 430/5 |
| 5,830,606 A | * | 11/1998 | Okamoto .................. 430/5 |
| 5,912,727 A | * | 6/1999 | Kawai ..................... 355/67 |
| 6,316,163 B1 | * | 11/2001 | Magoshi et al. ........... 430/296 |
| 2001/0036604 A1 | * | 11/2001 | Kawashima ............... 430/394 |

* cited by examiner

*Primary Examiner*—Mark F. Huff
*Assistant Examiner*—Kripa Sagar
(74) *Attorney, Agent, or Firm*—Finnegan, Henderson, Farabow, Garrett & Dunner, L.L.P.

(57) ABSTRACT

A resist pattern forming method of forming a pattern on a resist film formed on a wafer by using a projection exposure apparatus generates a resized pattern of an active area and its inverted pattern, then generates a logical product pattern of a gate pattern to be exposed and the resized pattern, generates a first mask having a logical sum pattern of the inverted pattern and the logical product pattern as a light shielding film, generates a second mask having a logical sum pattern of the resized pattern and the gate pattern as a light shielding film, exposes the resist film on the wafer using the first mask under a condition that an numerical aperture of the projection exposure apparatus is small, and then exposes the resist film on the wafer using the second mask under a condition that the numerical aperture of the projection exposure apparatus is large.

14 Claims, 3 Drawing Sheets

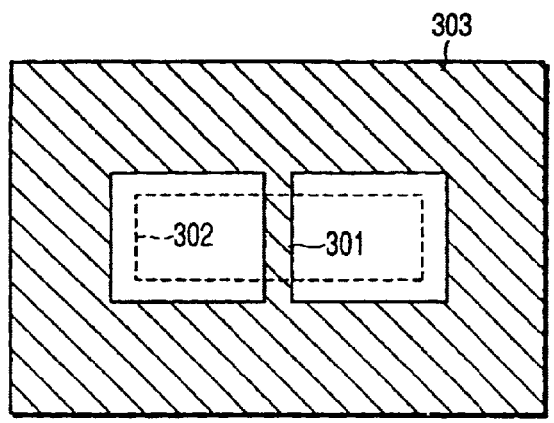
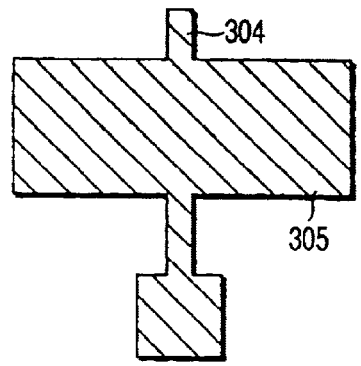
FIG. 3A    FIG. 3B
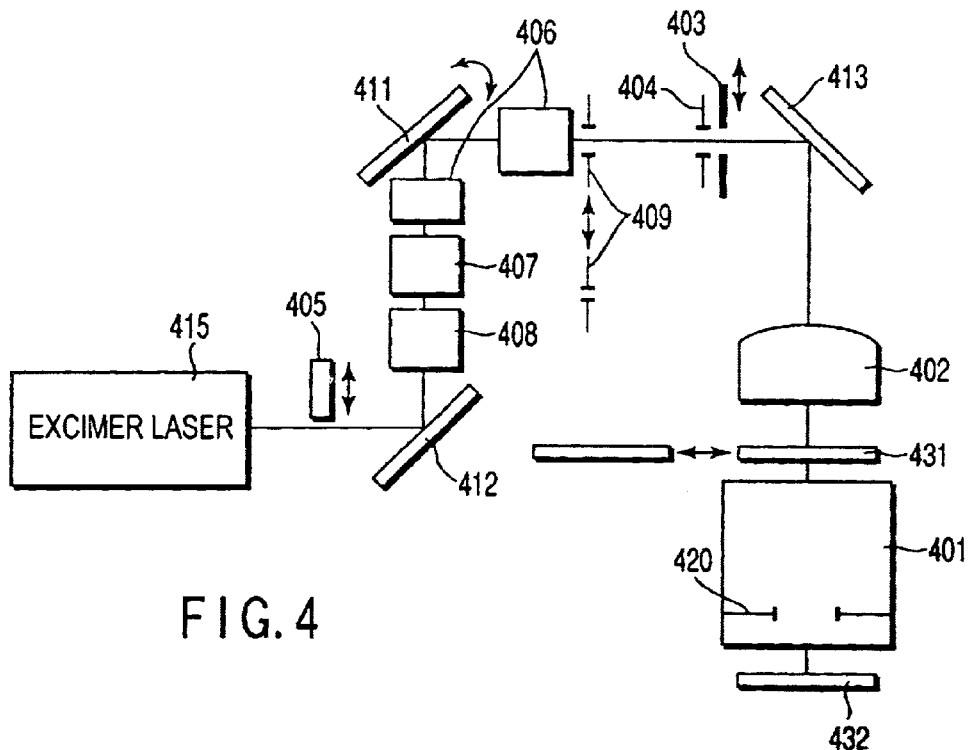
FIG. 4
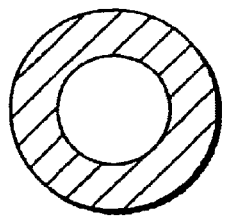
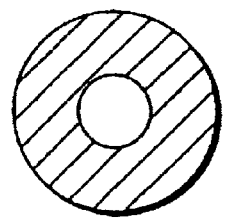
FIG. 5A    FIG. 5B

RESIST PATTERN FORMING METHOD

CROSS-REFERENCE TO RELATED APPLICATIONS

This application is based upon and claims the benefit of priority from the prior Japanese Patent Application No. 11-256205, filed Sep. 9, 1999, the entire contents of which are incorporated herein by reference.

BACKGROUND OF THE INVENTION

The present invention relates to a lithography technology for semiconductors, and, more particularly, to a resist pattern forming method for forming a gate pattern or the like on a resist film on a wafer.

The integration level of LSIs is ever improving and the design rules for interconnection or the like inside LSIs are becoming smaller and smaller. With the reduction in design rules, the photolithography technology is advancing. For example, the exposure wavelength is shortened from the wavelength of a KrF excimer laser (wavelength of 248 nm) to the wavelength of an ArF excimer laser (wavelength of 193 nm) and the diameter of the light emitting lens of an exposure apparatus is made larger (larger numerical aperture), thus leading to an improvement on the resolution.

It is known from the Rayleigh's equation that the resolution R is given by the following equation:

$$R = k_1(\lambda/NA) \quad (1)$$

where $\lambda$ is the exposure wavelength, NA is the numerical aperture and $k_1$ is a constant which is determined by a process of a resist or the like. It is understood from the equation 1 that $\lambda$ should be made smaller or NA should be made larger in order to improbe the resolution.

In the actual mass production, the yield falls unless a certain degree of or higher process margin is secured. One important index for the process margin is a focus depth (DOF) which is expressed by $$DOF = k_2(\lambda/NA^2) \quad (2)$$

where $k_2$ is a constant. It is apparent from the equation 2 that $\lambda$ should be made greater or NA should be made smaller in order to increase DOF.

It is apparent from the equations 1 and 2 that increasing the resolution by increasing NA reduces DOF. As DOF decreases by a factor of the square of NA, increasing NA drastically reduces DOF. To ensure both certain levels of resolution and process margin, therefore, it is desirable that NA and $\lambda$ should both be small.

With regard to the gate patterns of transistors, the uniform operational performance of transistors is demanded, so that the gate line width should be controlled strictly. This requires that lithography for forming a gate pattern have a sufficient process margin. In forming minute gate patterns, therefore, NA cannot be made so large while the exposure wavelength $\lambda$ may be made shorter.

In forming the gate of a transistor, the gate pattern is formed on a resist by performing single exposure on the gate portion and the other, contact pad and minute space portions using the same mask. One consideration that should be taken in this case is the fact that the gate pattern as well as a contact pattern and other patterns lie on the layer where the gate is to be formed. When minute space is present on such a layer, in particularly, the minute space cannot be formed with a high resolution if NA is small. This means that reducing NA has a limit.

For a repeated pattern portion in a dynamic RAM or the like where cells are densely located, a high resolution is demanded so that a larger NA is desirable. By contrast, the peripheral portion of a cell has a large pattern size and does not have fewer dense patterns, requiring the focus depth more than the resolution. It is therefore desirable to have a smaller NA. In the case of exposing the cell portion and the peripheral portion with the same mask, therefore, the optimal NA may not exist.

Because there are many isolated lines in the gate portion where line width control is required in the formation of the gate pattern of a transistor in minute patterns which demands a dimensional precision, the numerical aperture NA of an exposure apparatus should be small from the viewpoint of the process margin. However, exposure with a small numerical aperture NA ay disable the formation of some of other patterns than the gate portion which do not require line width control. This problem could not be overcome even by changing the conditions of the exposure apparatus.

BRIEF SUMMARY OF THE INVENTION

Accordingly, it is an object of the present invention to provide a resist pattern forming method which has a sufficient process margin for a gate pattern and a sufficient resolution for a minute pattern of space or the like.

It is another object of this invention to provide an exposure apparatus that ensures a sufficient process margin for an isolated pattern whose peripheral portion has a large size while keeping a certain level of resolution for a repeated pattern in a dynamic RAM or the like which is densed with cells To achieve the above objects, according to one aspect of this invention, there is provided a resist pattern forming method of forming a resist pattern by exposing continual gate patterns inside and outside an active area onto a resist film formed on a wafer having the active area pattern on a major surface using a projection exposure apparatus, comprising the steps of exposing those gate patterns that lie in the active area onto the resist film under a condition that an numerical aperture of the projection exposure apparatus is small; and exposing those gate patterns that lie outside the active area onto the resist film under a condition that the numerical aperture of the projection exposure apparatus is large.

According to another aspect of this invention, there is provided a resist pattern forming method of forming a resist pattern by exposing a pattern of a memory cell portion and a pattern of an other portion than the memory cell portion on a resist film formed on a wafer using a projection exposure apparatus, comprising the steps of exposing the pattern of the memory cell portion onto the resist film under a condition that an numerical aperture of the projection exposure apparatus is large; and exposing the pattern of the other portion than the memory cell portion onto the resist film under a condition that the numerical aperture of the projection exposure apparatus is small.

According to a further aspect of this invention, there is provided a resist pattern forming method of forming a resist pattern by exposing continual gate patterns inside and outside an active area onto a resist film formed on a wafer having the active area pattern on a major surface using a projection exposure apparatus, comprising a first step of resizing a pattern equivalent to an active area on the wafer; a second step of inverting the pattern resized in the first step; a third step of obtaining a logical product of the pattern resized in the first step and a gate pattern to be exposed; a fourth step of forming a first mask having a pattern equivalent to a logical sum of the inverted pattern formed in the second step and the logical product pattern formed in the third step; a fifth step of forming a second mask having a pattern equivalent to a logical sum of the pattern resized in the first step and the gate pattern to be exposed; a sixth step of exposing the resist film on the wafer using the first mask formed in the fourth step under a condition that an numerical aperture of the projection exposure apparatus is small; and a seventh step of exposing the resist film on the wafer using the second mask formed in the fifth step under a condition that the numerical aperture of the projection exposure apparatus is large.

According to a still further aspect of this invention, there is provided a resist pattern forming method of forming a resist pattern by exposing continual gate patterns inside and outside an active area onto a resist film formed on a wafer having the active area pattern on a major surface using a projection exposure apparatus, comprising the steps of resizing a pattern equivalent to an active area on the wafer; inverting the resized pattern; obtaining a logical product of the resized pattern and a gate pattern to be exposed; forming a first mask using the inverted pattern as a light shielding film and a pattern acquired by obtaining the logical product as a half-tone phase shifter; forming a second mask using the resized pattern as a light shielding film and the gate pattern to be exposed as a half-tone phase shifter; exposing the resist film on the wafer using the first mask under a condition that an numerical aperture of the projection exposure apparatus is small; and exposing the resist film on the wafer using the second mask under a condition that the numerical aperture of the projection exposure apparatus is large.

With the above structures of this invention, exposing a gate pattern on an active area with a small numerical aperture NA can form a pattern with a sufficient process margin with respect to the gate pattern. Further, exposing a pattern other than the gate pattern in the active area with a large numerical aperture NA can form a pattern with a sufficient resolution with respect to minute space or the like.

According to this invention, exposing a dense repeated pattern portion with a large numerical aperture NA can form a pattern with a sufficient resolution with respect to the dense repeated pattern portion. Further, exposing an isolated pattern portion which has a large pattern size with a small numerical aperture NA can ensure exposure with a sufficient process margin with respect to such an isolated pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are plan views showing masks formed according to the first embodiment;

FIG. 4 is a schematic structural diagram showing one example of an exposure apparatus with a variable numerical aperture NA;

FIGS. 5A and 5B are plan views exemplarily illustrating a state with a large numerical aperture NA and a state with a small numerical aperture NA;

DETAILED DESCRIPTION OF THE INVENTION

The details of the present invention will now be described by referring to illustrated embodiments.

First Embodiment

Figure 1:
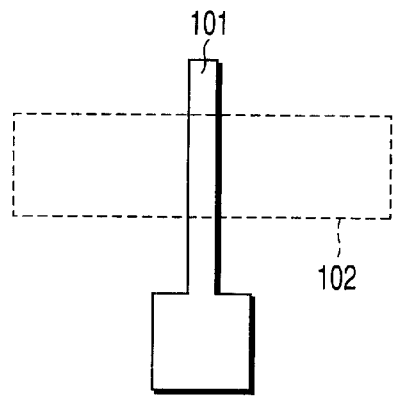
FIG. 1 is a plan view showing a gate pattern to be formed and an active area pattern according to a first embodiment of this invention.

FIG. 1 is a diagram exemplifying a pattern to be formed according to this embodiment. FIG. 1 shows a gate pattern 101 including a gate portion and a contact pad portion and a pattern 102 of an active area which is associated with dimensional control. The characteristics of a transistor are determined by the gate line width on the active area. It is thus necessary to adequately control the gate line width on the active area.

A description will now be given of how to separate a mask from pattern data as shown in FIG. 1 to a mask for a gate portion and a mask for the other patterns. A resist in use in this example is a positive resist.

Figure 2C:
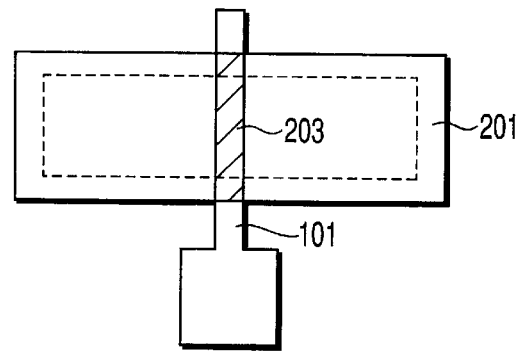
FIGS. 2A through 2E are plan views showing a resist pattern forming process according to the first embodiment.
Figure 2A:
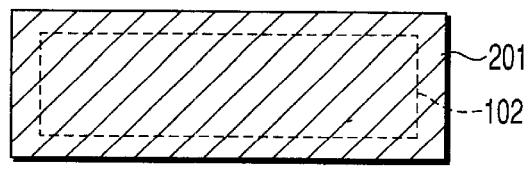

First, the active area pattern 102 in FIG. 1 is resized to become larger, thus forming a resized pattern 201 as shown in FIG. 2A. The resizing of the active area pattern 102 is carried out in consideration of the amount of misalignment between first and second masks to be discussed later. Next, the resized pattern 201 is inverted to thereby yield a inverted pattern 202 as shown in FIG. 2B. Then, the logical product of the gate pattern 101 and the resized pattern 201 is obtained, thus yielding a logical product pattern 203, as shown in FIG. 2C.

Figure 2D:
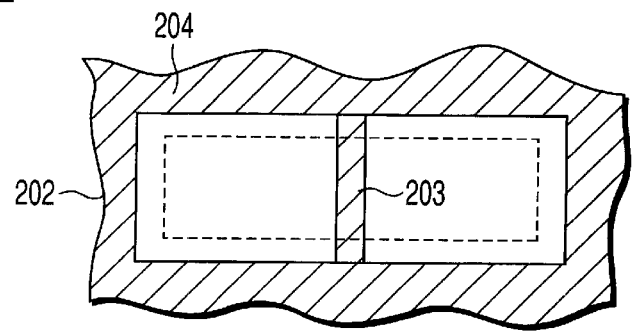
Figure 2B:
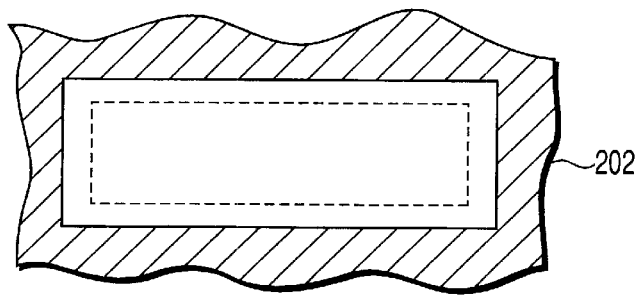

Next, the logical sum of the logical product pattern 203 and the inverted pattern 202 is obtained to thereby yield a logical sum pattern 204 as shown in FIG. 2D. Based on this logical sum pattern 204, a first photomask as shown in FIG. 3A is generated. Note that the logical sum pattern 204 is not limited to the logical sum of the logical product pattern 203 and the inverted pattern 202 but may be the logical sum of the inverted pattern 202 and the gate pattern 101.

Figure 2E:
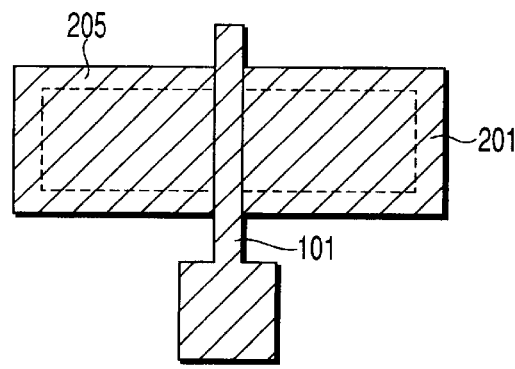

Then, the logical sum of the gate pattern 101 and the resized pattern 201 is acquired, thus yielding a logical sum pattern 205 as shown in FIG. 2E. Based on this logical sum pattern 205, a second photomask as shown in FIG. 3B is generated.

The first and second photomasks are a Cr pattern as a light shielding film formed on a transparent substrate of quartz or the like. This Cr pattern may be formed by using an electron beam writing apparatus or the like which has a higher resolution than that of an exposure apparatus. In FIG. 3A, "301" denotes a light shielding portion corresponding to the logical product pattern 203, "302" denotes an area equivalent to the active area 102, and "303" denotes a light shielding portion corresponding to the inverted pattern 202. In FIG. 3B, "304" denotes a light shielding portion corresponding to the gate pattern 101 and "305" denotes a light shielding portion corresponding to the resized pattern 201.

Next, with a resist-applied wafer placed in a projection exposure apparatus, exposure with a small numerical aperture NA was conducted using the first mask, followed by exposure with a large numerical aperture NA using the second mask. This made it possible to form the gate portion that has a large process margin and the pattern of the other portions than the gate portion, that has a high resolution. The use of the active area resized to a larger size at this time led to an excellent dimensional controllability of the gate portion on the edge portion of the active area.

Executing two exposures with the numerical aperture NA switched from one to another may be accomplished by changing the NA stop of the projection exposure apparatus between the exposure using the first mask and the exposure using the second mask, or by using two types of projection exposure apparatuses with different numerical apertures NA.

The following will discuss an example where the same projection exposure apparatus is used to perform two exposure by switching the numerical aperture NA. FIG. 4 shows a projection exposure apparatus which is used in this method. This projection exposure apparatus has a reduction projection lens 401, a condenser lens 402, a reticle blind 403, a slit aperture stop 404, a shutter 405, a fly-eye lens 406, a beam shaping optical system 407, an attenuator 408, a light source stop 409, a vibration mirror 411, fixed mirrors 412 and 413, an excimer laser source 415, an NA stop 420 a reticle (mask) 431 and a wafer 432.

The NA stop 420 is variable and can equivalently take a state with a large numerical aperture NA shown in FIG. 5A and a state with a small numerical aperture NA shown in FIG. 5B. With regard to the mask 431, plural types of masks can be changed in the projection exposure apparatus.

Two masks as shown in FIGS. 3A and 3B are prepared as the mask 431. With the first mask set at a predetermined position, first exposure is performed on the resist on the wafer in the state with a small numerical aperture NA shown in FIG. 5B using the projection exposure apparatus. Then, the first mask is removed from the predetermined position, the NA stop 420 is adjusted with the second mask set at a predetermined position, and second exposure is performed on the resist on the wafer in the state with a large numerical aperture NA shown in FIG. 5A.

As this method, which involves two exposures, does not place a wafer outside the projection exposure apparatus, the resist on the wafer is not influenced by the outside air. At the time of carrying out the second exposure, the illumination shape of the projection exposure apparatus may also be changed.

In the case of using two projection exposure apparatuses with different numerical apertures NA, after first exposure is carried out using the first mask, the wafer is transferred into another exposure apparatus where second exposure takes place. In this case, the wafer is temporarily placed outside the exposure apparatus, the resist may be influenced by the outside air before the second exposure takes place. To avoid such an influence, the wafer may be subjected to a heat treatment after first exposure before being transferred into another exposure apparatus.

This embodiment is effective for a mask whose light shielding portion is formed of Cr as well as a mask whose light shielding portion is formed by a half-tone phase shifter. Because of a gate portion containing multiple isolated lines, it was more effective to use illumination whose coherence factor was large or to use modified illumination such as annular band illumination.

As a gate portion does not consist of isolated lines alone and small-NA exposure is executed, an optical proximity effect may be required in some case. When a plurality of gate patterns are located in the same active area, particularly, the proximity effect influences adjacent gate patterns, so that it is desirable to compensate for this influence.

While the resizing amount of the active area needed is the amount of misalignment (normally about 50 nm) between exposure using the first mask and exposure using the second mask, the resizing amount should be the sum of the amount of misalignment and the distance over which the optical proximity effect extends, in consideration of the influence of the optical proximity effect.

Second Embodiment

The light shielding portions of the first mask and the second mask in the first embodiment were formed of Cr alone or by a half-tone phase shifter alone. When a half-tone phase shifter is used for the light shielding portion, slight light that has passed through the light shielding portion 303 hits the light shielding portion 304 depending on the light transmittance. Further, slight light that has passed through the light shielding portion 305 hits the light shielding portion 301, thus deteriorating the process margin corresponding to the gate portion of the light shielding portion 301.

Figure 6A:
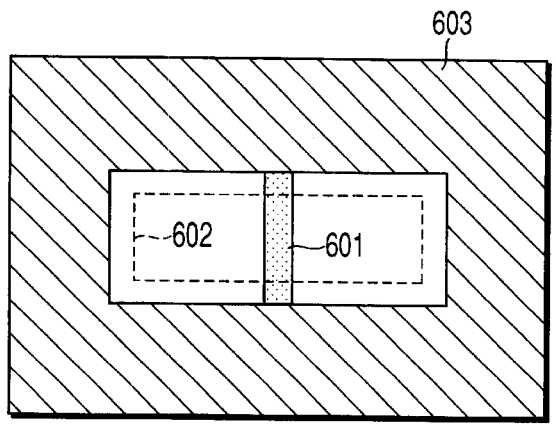
FIGS. 6A and 6B are plan views showing masks formed according to a second embodiment of this invention.
Figure 6B:
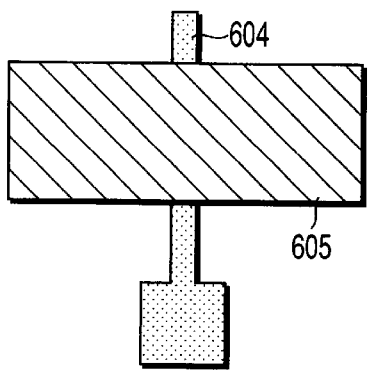

To avoid such light penetration, the light shielding portion 301 of the first mask and the light shielding portion 304 of the second mask are formed by half-tone phase shifters 601 and 604 and the light shielding portion 303 of the first mask and the light shielding portion 305 of the second mask are formed by Cr films 603 and 605 in this embodiment as shown in FIGS. 6A and 6B. The portions 601 to 605 in FIGS. 6A and 6B correspond to the portions 301 to 305 in FIGS. 3A and 3B. This structure can suppress the degrading of the resolution and form a gate portion with a high process margin through light exposure.

It is desirable to use modified illumination, such as annular band illumination, or use an optical proximity effect correcting scheme together as per the first embodiment. It is also desirable that the resizing amount of the active area needed should be the sum of the amount of misalignment (normally about 50 nm) between exposure using the first mask and exposure using the second mask and the distance over which the optical proximity effect extends, as per the first embodiment.

Third Embodiment

Figure 7:
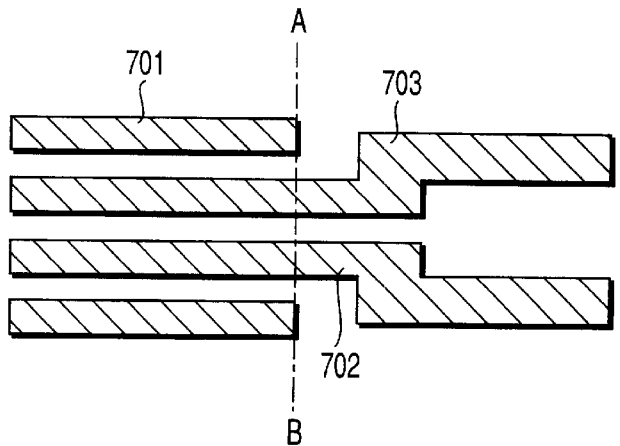
FIG. 7 is a plan view depicting a pattern to be formed according to a third embodiment of this invention.

Referring now to FIG. 7, the third embodiment of this invention will be discussed. FIG. 7 is a diagram depicting a pattern in the vicinity of the boundary between a cell portion and a peripheral circuit portion in a dynamic RAM or the like. Reference symbol "AB" in the diagram denotes the boundary between a cell portion 701 and a peripheral portion 703. Reference numeral "702" is a link portion which links the cell portion 701 and the peripheral portion 703.

In this embodiment, the pattern is separated into two sub patterns at the boundary AB between the cell portion 701 and the peripheral portion 703. The sub patterns are formed on separate masks respectively. A first mask is the mask that includes the pattern of the cell portion 701 and a second mask is the mask that includes the patterns of the link portion 702 and the peripheral portion 703.

After exposure with a large numerical aperture NA using the first mask is carried out, exposure with a small numerical aperture NA using the second mask is performed. This method can permit a dense repeated pattern portion to be exposed with a sufficient resolution and permit an isolated peripheral portion which has a large pattern size to be exposed with a sufficient process margin.

Fourth Embodiment

Figure 8:
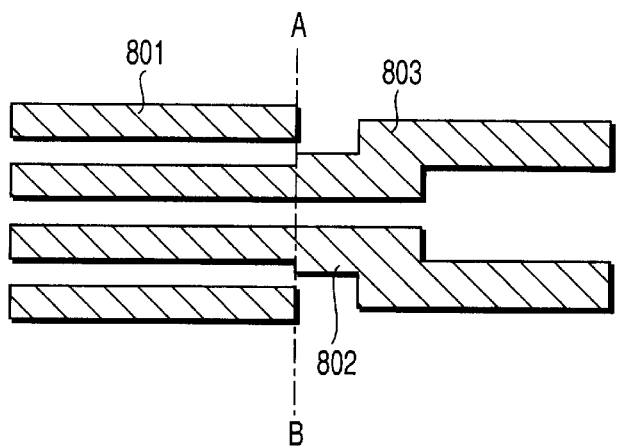
FIG. 8 is a plan view depicting a pattern to be formed according to a fourth embodiment of this invention.

Referring now to FIG. 8, the fourth embodiment of this invention will be discussed. FIG. 8 is a diagram showing a pattern in the vicinity of the boundary between a cell portion and a peripheral circuit portion in a dynamic RAM or the like. Reference symbol "AB" in the diagram denotes the boundary between a cell portion 801 and a peripheral portion 803. Reference numeral "802" is a link portion which links the cell portion 801 and the peripheral portion 803.

In this embodiment, the pattern is separated into two sub patterns at the boundary AB between the cell portion 801 and the peripheral portion 803. The sub patterns are formed on separate masks respectively. In addition, the link portion 802 between the cell portion 801 and the peripheral portion 803 is resized to become greater than the pattern size of the cell portion 801. A first mask is the mask that includes the pattern of the cell portion 801 and a second mask is the mask that includes the patterns of the link portion 802 and the peripheral portion 803.

After exposure with a large numerical aperture NA using the first mask is carried out, exposure with a small numerical aperture NA using the second mask is performed. This method can permit a dense repeated pattern portion to be exposed with a sufficient resolution and permit an isolated peripheral portion which has a large pattern size to be exposed with a sufficient process margin.

As the pattern width of the link portion 802 between the cell portion 801 and the peripheral portion 803 had been made thicker beforehand in this embodiment, no disconnection occurred in the link portion 802 between the cell portion 801 and the peripheral portion 803 even when misalignment between exposure using the first mask and exposure using the second mask was prominent.

This invention is in no way limited to the above-described embodiments. Although the first and second masks are formed on the assumption of using a positive resist in the individual embodiments, those masks can be formed on the assumption of using a negative resist. Further, the apparatus that produces the first and second masks is not limited to an electron beam writing apparatus, but may take any form as long as it can write a pattern with a sufficiently high resolution. Furthermore, the structure of the projection exposure apparatus which exposes a pattern on a wafer using the first and second masks is in no way limited to the one shown in FIG. 4, but may be modified as needed according to the specifications. It should be apparent to those skilled in the art that the present invention may be modified in various other forms without departing from the spirit or scope of the invention.

What is claimed is:

1. A method for forming a resist pattern by exposing, to continual gate patterns inside and outside an active area, a resist film formed on a wafer having said active area pattern on a major surface, using a projection exposure apparatus, comprising:

resizing a pattern equivalent to an active area on said wafer;

inverting said resized pattern;

obtaining a logical product of said resized pattern and a gate pattern to be exposed;

forming a first mask having a pattern equivalent to a logical sum of said inverted pattern formed in said inverting said resized pattern and said logical product pattern formed in said obtaining the logical product;

forming a second mask having a pattern equivalent to a logical sum of said pattern resized in said resizing the pattern and said gate pattern to be exposed;

exposing said resist film on said wafer using said first mask formed in said forming the first mask under a condition that said projection exposure apparatus has a first numerical aperture; and exposing said resist film on said wafer using said second mask formed in said forming the second mask under a condition that said projection exposure apparatus has a second numerical aperture larger than the first numerical aperture.

2. The resist pattern forming method according to claim 1, wherein when a plurality of gate patterns are present in a same active area, proximity effect correction is performed on adjoining gate patterns.

3. The resist pattern forming method according to claim 1, wherein resizing said pattern equivalent to said active area on said wafer comprises making that pattern larger.

4. The resist pattern forming method according to claim 1, wherein a resizing amount of said pattern equivalent to said active area is set to a sum of an amount of misalignment between exposure using said first mask and exposure using said second mask and a distance over which a proximity effect extends.

5. The resist pattern forming method according to claim 1, wherein a same projection exposure apparatus having a variable numerical aperture is used to ensure switching of said numerical aperture between exposing using said first mask and exposing using said second mask.

6. The resist pattern forming method according to claim 1, wherein different projection exposure apparatuses having different numerical apertures are used to ensure switching of said numerical aperture between exposing using said first mask and exposing using said second mask.

7. The resist pattern forming method according to claim 1, wherein instead of obtaining a logical product of said resized pattern and a gate pattern to be exposed and forming a first mask having a pattern equivalent to a logical sum of said inverted pattern formed in said inverting said resized pattern and said logical product pattern, a first masks having a pattern equivalent to a logical sum of said inverted pattern and a gate pattern to be exposed is formed.

8. A method for forming a resist pattern by exposing, to continual gate patterns inside and outside an active area, a resist film formed on a wafer having said active area pattern on a major surface using a projection exposure apparatus, comprising:

resizing a pattern equivalent to an active area on said wafer; inverting said resized pattern;

obtaining a logical product of said resized pattern and a gate pattern to be exposed;

forming a first mask using said inverted pattern as a light shielding film and a pattern acquired by obtaining said logical product as a half-tone phase shifter;

forming a second mask using said resized pattern as a light shielding film and said gate pattern to be exposed as a half-tone phase shifter;

exposing said resist film on said wafer using said first mask under a condition that said projection exposure apparatus has a first numerical aperture; and exposing said resist film on said wafer using said second mask under a condition that said projection exposure apparatus has a second numerical aperture larger than the first numerical aperture.

9. The resist pattern forming method according to claim 8, wherein when a plurality of gate patterns are present in a same active area, proximity effect correction is performed on adjoining gate patterns.

10. The resist pattern forming method according to claim 8, wherein said pattern equivalent to said active area on said wafer is resized to be made larger.

11. The resist pattern forming method according to claim 8, wherein a resizing amount of said pattern equivalent to said active area is set to a sum of an amount of misalignment between exposure using said first mask and exposure using said second mask and a distance over which a proximity effect extends.

12. The resist pattern forming method according to claim 8, wherein a same projection exposure apparatus having a variable numerical aperture is used to ensure switching of said numerical aperture between exposure using said first mask and exposure using said second mask.

13. The resist pattern forming method according to claim 8, wherein different projection exposure apparatuses having different numerical apertures are used to ensure switching of said numerical aperture between exposure using said first mask and exposure using said second mask.

14. A method for forming a resist pattern by exposing, to continual gate patterns inside and outside an active area, a resist film formed on a wafer having said active area pattern on a major surface using a projection exposure apparatus, comprising:

resizing a pattern equivalent to an active area on said wafer;

inverting said resized pattern;

obtaining a logical product of said resized pattern and a gate pattern to be exposed;

forming a first mask using said inverted pattern as a light shielding film and a pattern acquired by obtaining said logical product as a half-tone phase shifter;

forming a second mask using said resized pattern as a light shielding film and said gate pattern to be exposed as a half-tone phase shifter;

exposing said resist film on said wafer using said first mask under a condition that said projection exposure apparatus has a first numerical aperture; and exposing said resist film on said wafer using said second mask under a condition that said projection exposure apparatus has a second numerical aperture larger than the first numerical aperture, wherein when a plurality of gate patterns are present in a same active area, proximity effect correction is performed on adjoining gate patterns, and wherein a resizing amount of said pattern equivalent to said active area is set to a sum of an amount of misalignment between exposure using said first mask and exposure using said second mask and a distance over which a proximity effect extends.

* * * * *